United States Patent
Hekmat et al.

(10) Patent No.: US 9,344,305 B2
(45) Date of Patent: May 17, 2016

(54) PVT TOLERANT DIFFERENTIAL CIRCUIT

(71) Applicant: SAMSUNG DISPLAY CO., LTD., Yongin, Gyeonggi-Do (KR)

(72) Inventors: Mohammad Hekmat, Mountain View, CA (US); Amir Amirkhany, Sunnyvale, CA (US)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/254,813

(22) Filed: Apr. 16, 2014

(65) Prior Publication Data

US 2014/0314173 A1   Oct. 23, 2014

Related U.S. Application Data

(63) Continuation-in-part of application No. 14/061,637, filed on Oct. 23, 2013.

(60) Provisional application No. 61/814,756, filed on Apr. 22, 2013, provisional application No. 61/845,120, filed on Jul. 11, 2013.

(51) Int. Cl.
  *H04L 25/49* (2006.01)
  *H04L 25/06* (2006.01)
  *H03F 3/45* (2006.01)

(52) U.S. Cl.
  CPC ........ *H04L 25/4919* (2013.01); *H03F 3/45183* (2013.01); *H04L 25/06* (2013.01); *H03F 2203/45032* (2013.01); *H03F 2203/45244* (2013.01)

(58) Field of Classification Search
  CPC ..................... H04L 25/4919; H03F 2200/453; H03F 2203/45244; H03F 1/3211; H03F 3/45071; H03K 2005/00208
  See application file for complete search history.

(56) References Cited

U.S. PATENT DOCUMENTS 5,726,597 A   3/1998   Petty et al.
6,222,395 B1  4/2001   Bertin et al.
(Continued)

FOREIGN PATENT DOCUMENTS

EP    1 104 092 A2   5/2001
WO    WO 99/07067 A1  2/1999

OTHER PUBLICATIONS

Martin, et al.; 8Gb/s Differential Simultaneous Bidirectional Link with 4mV 9ps Waveform Capture Diagnostic Capability; ISSCC 2003/Session 4/Clock Recovery and Backplane Transceivers / Paper 4.5, 2003 IEEE International Solid-State Circuits Conference; © 2003;10pps.
Garlepp, et al.; A 1-10Gpbs PAM2, PAM4, PAM2 Partial Response Receiver Analog Front End with Dynamic Sampler Swapping Capability for Backplane Serial Communications; 2005 Symposium on VLSI Circuits Digest of Technical Papers; pp. 376-379.
(Continued)

*Primary Examiner* — Curtis Odom
(74) *Attorney, Agent, or Firm* — Lewis Roca Rothgerber Christie LLP

(57) ABSTRACT

An automatically calibrated differential amplifier including: an input stage differential amplifier configured to receive a input differential signal, to differentially amplify the input differential signal to generate an input stage output differential signal, and to have an input stage bias current; and a replica stage differential amplifier configured to automatically calibrate the input stage bias current in response to process or environmental variations. The differential amplifier may be included, for example, in a comparator and a multilevel receiver.

16 Claims, 8 Drawing Sheets

(56) References Cited

U.S. PATENT DOCUMENTS

| | | |
|---|---|---|
| 6,623,732 B1 | 9/2003 | Ma |
| 6,927,714 B1 | 8/2005 | Teterwak |
| 7,283,596 B2 | 10/2007 | Brown |
| 8,222,954 B1 | 7/2012 | Ren et al. |
| 2002/0000883 A1 | 1/2002 | Cox |
| 2005/0151588 A1 | 7/2005 | Bailey et al. |
| 2007/0057724 A1* | 3/2007 | Koizumi et al. ............. 330/253 |
| 2008/0187037 A1* | 8/2008 | Bulzacchelli ............ H03K 5/02 375/233 |
| 2009/0039958 A1 | 2/2009 | Wu |
| 2009/0189694 A1 | 7/2009 | Davierwalla et al. |
| 2009/0251217 A1* | 10/2009 | Keerti ........................... 330/264 |
| 2011/0115561 A1 | 5/2011 | Kumar et al. |

OTHER PUBLICATIONS

Garg; A 1-Tap 40Gbps Look-Ahead Decision Feedback Equalizer in 0.18-μm SiGe BiCMOS Technology; Graduate Department of Electrical and Computer Engineering, University of Toronto; © 2005; 70 pps.

EPO Search Report dated Jul. 8, 2014, for corresponding European Patent application 14165501.9, (6 pages).

EPO Search Report dated Jan. 5, 2015, for corresponding European Patent application 14176819.2, (5 pages).

U.S. Office action dated Dec. 2, 2015, for cross reference U.S. Appl. No. 14/061,637, (12 pages).

EPO Search Report dated May 12, 2015, for corresponding European Patent application 14176819.2, (8 pages).

* cited by examiner

PVT TOLERANT DIFFERENTIAL CIRCUIT

CROSS-REFERENCE TO RELATED APPLICATION

This utility patent application is a continuation-in-part of U.S. application Ser. No. 14/061,637, filed Oct. 23, 2013, entitled Mismatched Differential Circuit, which claims priority to and the benefit of U.S. Provisional Application No. 61/814,756, filed Apr. 22, 2013, entitled Triple-Mismatched Differential Pair, and claims priority to and the benefit of U.S. Provisional Application No. 61/814,756 and U.S. Provisional Application No. 61/845,120, filed Jul. 11, 2013, entitled A PVT-Tolerant Multi-Level Receiver Front-End, the entire contents of all of these applications are incorporated herein by reference.

BACKGROUND

1. Field

Aspects of the present invention relate to a process, voltage, and temperature (PVT) tolerant differential circuit and a comparator including the PVT tolerant differential circuit.

2. Description of Related Art

A differential circuit (or differential amplifier) is a kind of electronic circuit that amplifies the difference between two input signals. A common configuration of a differential circuit is a differential pair, which includes two amplifying stages with common degeneration.

Many electronic devices use differential circuits. For example, a comparator, which is a device that compares two input signals and outputs a signal based on this comparison, may use a differential circuit. In one configuration, a comparator receives two input signals and outputs a signal indicating which of the received signals is larger. In another configuration, a comparator receives two signals (e.g., two complementary signals) and outputs a signal indicating whether or not the difference between the two received signals is greater than a detection level.

A comparator implemented to perform the above-described level detection has numerous applications, including multilevel serial/parallel links, analog-to-digital converters, and peak detection. Mismatched differential circuits (e.g., circuits with mismatched amplifier stages) may be used in a comparator to set the offset voltage adjustment and for level detection. Enabling a wide range of detection levels is desirable to extend the usable range of a comparator circuit (e.g., to increase the detection range).

Additionally, it is desirable to have differential circuits which are resilient to environmental or process variations. For example, in multilevel systems, the various detection level voltages should, ideally, remain constant under process, voltage, and temperature (PVT) variations; otherwise the system may fail, may be error prone, or may require over-designing to accommodate the variations. As described above, the detection level voltages may be set using mismatched differential circuits; however, the detection levels of mismatched differential circuits are a function of the overdrive of the mismatched differential circuits, which may vary across PVT conditions.

SUMMARY

Aspects of the present invention are directed toward providing a mismatched differential circuit that remains resilient to process and environmental variations. For example, aspects of the present invention provide a process, voltage, and temperature (PVT) tolerant differential circuit. Differential circuits according to embodiments of the present invention may be used in comparators and multilevel receivers, as examples.

According to an embodiment of the present invention, the PVT tolerant differential circuit is a mismatched differential circuit having a predefined detection level. The detection level of the mismatched differential circuit may be kept constant even under process and environmental variations through the use of a feedback loop, which adjusts a bias current of the differential circuit. The feedback loop may include a replica stage differential circuit and use a reference voltage to compensate for process and environmental variations.

The range of detection levels of a comparator is extendable by controlling the mismatch between amplifier stages. For example, this mismatch may be controlled by mismatching the bulk potential or sizes of devices in the differential circuit of a comparator or by creating a bias current mismatch. In one embodiment, a triple-mismatched differential circuit, which includes devices having mismatched bulk potentials, sizes, and currents, is provided to enable a wide-range of detection levels for the comparator.

According to an embodiment of the present invention, a multilevel receiver having stable detection levels under environmental and process variations is provided. The multilevel receiver may include a plurality of comparators, each including a mismatched differential circuit having a predefined detection level that is maintained constant under process and environmental variations through the use of a feedback loop, which adjusts a bias current of the mismatched differential circuits. The feedback loop may include a replica stage mismatched differential circuit and use a reference voltage to compensate for process and environmental variations.

According to an embodiment of the present invention, a mismatched differential circuit that remains resilient to process and environmental variations is provided as part of a digital communication link for a display.

According to an embodiment of the present invention, there is provided an automatically calibrated differential amplifier including: an input stage differential amplifier configured to receive a input differential signal, to differentially amplify the input differential signal to generate an input stage output differential signal, and to have an input stage bias current; and a replica stage differential amplifier configured to automatically calibrate the input stage bias current in response to process or environmental variations.

The replica stage differential amplifier may be configured to: receive a reference differential signal; differentially amplify the reference differential signal to provide a replica stage output differential signal; and provide a reference current based on the replica stage output differential signal. Here, a replica stage bias current and the input stage bias current may be based on the reference current.

The replica stage differential amplifier may include: a first amplifier leg; a second amplifier leg; and a feedback circuit coupled to the first amplifier leg and the second amplifier leg, and configured to output the reference current. The first amplifier leg and the second amplifier leg, together, may be configured to differentially amplify the reference differential signal to provide the replica stage output differential signal, the feedback circuit may receive the replica stage output differential signal and may output the reference current according to the replica stage output differential signal, and a sum of a first amplifier leg current of the first amplifier leg and a second amplifier leg current of the second amplifier leg may equal the replica stage bias current.

The feedback circuit may include a comparator and a current generator, and the comparator may be configured to receive the replica stage output differential signal and to control the current generator to increment or decrement the reference current according to the replica stage output differential signal.

The feedback circuit may include an amplifier and a transistor, the transistor being configured to output the reference current, and the amplifier may be configured to receive the replica stage output differential signal and to control a gate voltage of the transistor according to the replica stage output differential signal to adjust the reference current.

The replica stage differential amplifier may further include: a first resistor having a first terminal coupled to a voltage source, and a second terminal; a second resistor having a first terminal coupled to the voltage source, and a second terminal; a first current sink configured to sink a first current; a second current sink configured to sink a second current; a first transistor having a first terminal coupled to the second terminal of the first resistor, a second terminal coupled to the first current sink, and a gate terminal configured to receive a first reference signal of the reference differential signal; a second transistor having a first terminal coupled to the second terminal of the second resistor, a second terminal coupled to the first current sink, and a gate terminal configured to receive a second reference signal of the reference differential signal; a third transistor having a first terminal coupled to the second terminal of the second resistor, a second terminal coupled to the second current sink, and a gate terminal configured to receive the second reference signal of the reference differential signal; a fourth transistor having a first terminal coupled to the second terminal of the first resistor, a second terminal coupled to the second current sink, and a gate terminal configured to receive the first reference signal of the reference differential signal; and a feedback circuit configured to receive the replica stage output differential signal from the first terminal of the first transistor and the first terminal of the second transistor, and to output the reference current. Here, the first current and the second current may be based on the reference current, and a sum of the first current and the second current may equal the replica stage bias current.

The automatically calibrated differential amplifier may further include a current mirror coupled to the input stage differential amplifier and the replica stage differential amplifier. Here, the current mirror may copy the reference current to control the input stage bias current.

The input stage differential amplifier may include a first amplifier leg including a first transistor and a second amplifier leg including a second transistor, and may be configured to be at an input stage of a comparator. Here, the first amplifier leg and the second amplifier leg, together, may be configured to differentially amplify the differential input signal, the input stage differential amplifier may be configured to have an input offset voltage, and the input offset voltage may correspond to a difference between a bulk potential of the first transistor and a bulk potential of the second transistor.

According to an aspect of the present invention, there is provided a multilevel signal receiver including: an input terminal configured to receive a multilevel differential signal; a data slicer coupled to the input terminal and configured to determine voltage levels of the multilevel differential signal, the data slicer including a plurality of input stage comparators and a replica stage comparator; and a decoder coupled to an output of the data slicer and configured to decode bits of the multilevel differential signal. Here, each of the input stage comparators includes an input stage differential amplifier, the input stage differential amplifier including: a first amplifier leg; and a second amplifier leg, the first amplifier leg and the second amplifier leg, together, are configured to differentially amplify the multilevel differential signal to provide a threshold determination signal, the input stage differential amplifier is configured to have an input offset voltage and an input stage bias current, and each of the input stage comparators is configured to have a threshold level different from the threshold level of other ones of the input comparators. Also, each of the input stage comparators is configured to output its threshold determination signal to the decoder to indicate whether or not the multilevel signal is greater than its threshold level, for each of the input stage comparators, the threshold level corresponds to the input offset voltage of the input stage differential amplifier. The replica stage comparator includes a replica stage differential amplifier, the differential amplifier including: a first amplifier leg; a second amplifier leg; and a feedback circuit configured to automatically adjust a replica stage bias current according to a replica stage differential output signal. For each of the input stage comparators, the input stage bias current of the input stage differential amplifier is based on the replica stage bias current.

The replica stage differential amplifier may be configured to: receive a reference differential signal; differentially amplify the reference differential signal to provide the replica stage output differential signal; and provide a reference current based on the replica stage output differential signal. The replica stage bias current and the input stage bias current may be based on the reference current.

The feedback circuit may be coupled to the first amplifier leg and the second amplifier leg of the replica stage differential amplifier, and configured to output the reference current, the first amplifier leg and the second amplifier leg of the replica stage differential amplifier, together, may be configured to differentially amplify the reference differential signal to provide the replica stage output differential signal, the feedback circuit may receive the replica stage output differential signal and may output the reference current according to the replica stage output differential signal, and a sum of a first amplifier leg current of the first amplifier leg and a second amplifier leg current of the second amplifier leg may equal the replica stage bias current.

The feedback circuit may include a comparator and a current generator. The comparator may be configured to receive the replica stage output differential signal and to control the current generator to increment or decrement the reference current according to the replica stage output differential signal.

The feedback circuit may include an amplifier and a transistor, the transistor being configured to output the reference current. The amplifier may be configured to receive the replica stage output differential signal and to control a gate voltage of the transistor according to the replica stage output differential signal to adjust the reference current.

The multilevel signal receiver may further include a current mirror coupled to the input stage differential amplifier of each of the input stage comparators and the replica stage differential amplifier. The current mirror may copy the reference current to control the input stage bias current of the input stage differential amplifier of each of the input stage comparators.

The replica stage differential amplifier may further include: a first resistor having a first terminal coupled to a voltage source, and a second terminal; a second resistor having a first terminal coupled to the voltage source, and a second terminal; a first current sink configured to sink a first current; a second current sink configured to sink a second current; a first transistor having a first terminal coupled to the second terminal of the first resistor, a second terminal coupled to the first current sink, and a gate terminal configured to receive a first reference signal of the reference differential signal; a second transistor having a first terminal coupled to the second terminal of the second resistor, a second terminal coupled to the first current sink, and a gate terminal configured to receive a second reference signal of the reference differential signal; a third transistor having a first terminal coupled to the second terminal of the second resistor, a second terminal coupled to the second current sink, and a gate terminal configured to receive the second reference signal of the reference differential signal; a fourth transistor having a first terminal coupled to the second terminal of the first resistor, a second terminal coupled to the second current sink, and a gate terminal configured to receive the first reference signal of the reference differential signal; and a feedback circuit configured to receive the replica stage output differential signal from the first terminal of the first transistor and the first terminal of the second transistor, and to output the reference current. Here, the first current and the second current may be based on the reference current, and a sum of the first current and the second current may equal the replica stage bias current.

The input offset voltage of the input stage differential amplifier of at least one of the input stage comparators may correspond to a difference between a bulk potential of the first transistor and a bulk potential of the second transistor.

BRIEF DESCRIPTION OF THE DRAWINGS

The accompanying drawings illustrate exemplary embodiments of the present invention, and, together with this specification, serve to explain features and aspects of the present invention.

DETAILED DESCRIPTION

Figure 1:
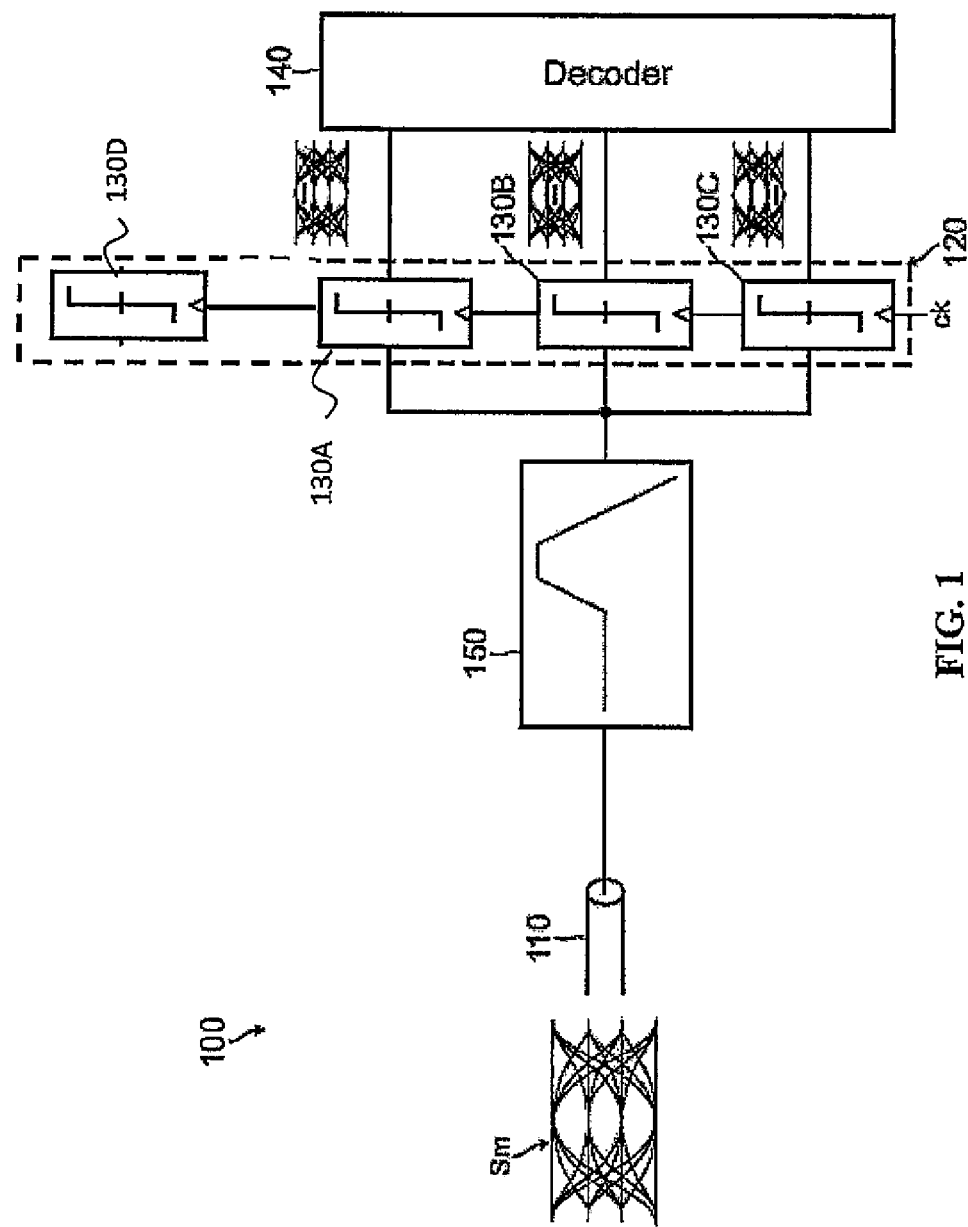
FIG. 1 illustrates a multilevel receiver according to an embodiment of the present invention.

Aspects of the present invention are directed toward providing a differential circuit that remains resilient to process and environmental variations.

Differential circuits according to embodiments of the present invention may be implemented as mismatched differential circuits, which may be included in comparators. For example, a mismatched differential circuit may be used to set a comparator's detection level. A mismatched differential circuit may be implemented as a differential amplifier pair (commonly referred to as a "differential pair"), where the two amplifying stages (or legs) with common (emitter, source, cathode, etc.) degeneration have different (or mismatched) properties. This property mismatch creates an inherent offset in the amplifying stages. Accordingly, by changing the property mismatch, the offset changes; thus, the comparator's detection level may be adjusted.

A comparator's detection level is also a function of an overdrive voltage of its input device, which varies according to the threshold voltage of the input device (e.g., a transistor). Specifically, the overdrive voltage may be defined by the equation, $V_{OV}=V_{GS}-V_t$. Where $V_{OV}$ is the overdrive voltage of the input device, $V_{GS}$ is the gate-to-source voltage of the input device, and $V_t$ is the threshold voltage of the device.

The device's threshold voltage may fluctuate according to process and environmental (e.g., voltage and temperature) variations; accordingly, the comparator's detection level may fluctuate in-turn according to process and environmental variations. A fluctuating detection level, however, may significantly hamper performance of the comparator. For example, the fluctuating detection level may cause detection errors. One way to compensate for this detection level fluctuation is to overdesign the system to account for the fluctuation. However, this may create undesirable design or power overhead.

Accordingly, aspects of the present invention automatically calibrate the differential circuit to maintain the comparator's detection level regardless of process, voltage, or temperature (PVT) variations. According to an embodiment, the detection level of comparator is maintained through a feedback loop that adjusts the bias current of the differential circuit to compensate for PVT variation.

For example, the feedback loop may employ a replica stage differential circuit and a reference voltage to adjust the bias current of the differential circuit to compensate for PVT variation. The reference voltage may be applied to the input of the replica stage differential circuit under a known operating condition (e.g., a maximum detection setting). The outputs of the replica stage differential circuit may be received by an amplifier (e.g., an analog amplifier) or a comparator (e.g., a digital comparator) that controls the bias current to force the outputs of the replica stage differential circuit to be at the same voltage for the given reference voltage at its input. The replica stage bias current may be replicated to the differential circuit.

Accordingly, the feedback loop maintains the detection level of the comparator under a variety of temperature and voltage conditions or under a variety of process corners. The above-described calibration together with a constant swing load keeps the threshold voltage, as well as an effective gain, of a differential circuit device constant across a PVT range. According to an aspect of the present invention, calibration at a single detection level is sufficient to guarantee tracking across all points because the threshold value has a mild non-linear dependence on the bias current.

According to an embodiment of the present invention, there is provided a multilevel receiver including a plurality of comparators each having different detection levels and each including a differential circuit. The multilevel receiver may further include a replica stage differential circuit to calibrate the other differential circuits such that they are PVT tolerant. To this end, the replica stage differential circuit may control the bias current of the other differential circuits to compensate for PVT variations.

Hereinafter, certain embodiments of the present invention are shown and described by way of illustration. As those skilled in the art would recognize, the invention may be embodied in many different forms and should not be construed as being limited to the embodiments set forth herein.

Instead, the detailed description should be construed to encompass the scope of the appended claims and equivalents thereof. Also, in the present application, when an element is referred to as being "coupled" (e.g., electrically coupled or connected) to another element, it may be directly coupled to the other element or indirectly coupled to the other element with one or more intervening elements interposed therebetween. Hereinafter, like reference numerals refer to like elements.

Expressions, such as "at least one of," when preceding a list of elements, modify the entire list of elements and do not modify the individual elements of the list. Further, the use of "may" when describing embodiments of the present invention refers to "one or more embodiments of the present invention."

The following example embodiments are described in the context of a multilevel data system for ease of explanation. A person of ordinary skill in the art would recognize, however, that the scope of the present invention is not limited thereto.

Multilevel data systems quantize data into more than two levels, thereby using less channel bandwidth than the same capacity binary data system. One such multilevel data system is a PAM-4 (pulse amplitude modulation-4 levels) data system. A PAM-4 data system may include a transmitter, a transmission link, and a receiver. The PAM-4 transmitter encodes a pair of bits into a four-level signal, for example, $V_1$, $V_2$, $V_3$, and $V_4$ (e.g., −0.66V, −0.33V, 0.33V, and 0.66V) and sends the encoded multilevel signal over the transmission link to the PAM-4 receiver. The PAM-4 receiver reconstructs the transmitted multilevel signal by comparing the received signal to three different detection level voltages, $V_{R1}$, $V_{R2}$, and $V_{R3}$.

In one embodiment of a PAM-4 receiver, the detection level voltages are determined according to the following logic: $V_1 < V_{R1} < V_2 < V_{R2} < V_3 < V_{R3} < V_4$. For example, where the four levels of the multilevel signal are −0.66V, −0.33V, 0.33V, and 0.66V, the detection level voltages may be −0.5V, 0V, and 0.5V (e.g., a differential configuration). In another example, where the four levels of the multilevel signal are 0V, 0.33V, 0.66V, and 1V, the detection level voltages may be 0.25V, 0.5V, and 0.75V (e.g., a single ended configuration).

Here, if the received multilevel signal is less than $V_{R1}$, then the receiver determines that the multilevel signal is transmitting the logic level associated with $V_1$ (e.g., 00). If the received multilevel signal is greater than $V_{R1}$, but less than $V_{R2}$, then the receiver determines that the multilevel signal is transmitting the logic level associated with $V_2$ (e.g., 01). If the received multilevel signal is greater than $V_{R2}$, but less than $V_{R3}$, then the receiver determines that the multilevel signal is transmitting the logic level associated with $V_3$ (e.g., 10). And, if the received multilevel signal is greater than $V_{R2}$, then the receiver determines that the multilevel signal is transmitting the logic level associated with $V_4$ (e.g., 11).

In an implementation of a PAM-4 receiver, the multilevel signal is reconstructed by using three comparators, each having a different detection level, and a decoder.

FIG. 1 illustrates a multilevel receiver according to an embodiment of the present invention.

According to an embodiment of the present invention, a pulse amplitude modulation (PAM) receiver 100 includes a transmission link 110 for receiving the multilevel data signal S. (which encodes more than one bit of data), a data slicer 120 that includes a plurality of comparators 130, and a decoder 140. The PAM receiver may also include a pre-amplifier 150 to provide gain level shifting and equalization to the multilevel data signal $S_m$ before it reaches the data slicer 120. According to an embodiment of the present invention, the multilevel data signal $S_m$ is a differential signal.

In accordance with one aspect of the present invention, a data slicer 120 includes a first comparator 130A that establishes a first detection level voltage $V_{R1}$, a second comparator 130B that establishes a second detection level voltage $V_{R2}$, and a third comparator 130C that establishes a third detection level voltage $V_{R3}$. As described above, the second detection level voltage $V_{R2}$ may be greater than the first detection level voltage $V_{R1}$ and less than the third detection level voltage $V_{R3}$.

In accordance with another aspect of the present invention, the data slicer 120 includes a replica stage (or dummy) comparator 130D. The replica stage comparator 130D automatically calibrates the comparators 130A, 130B, and 130C to maintain their detection levels despite variations in process, voltage, and temperature (PVT). A detailed description of the replica stage comparator 130D is given below.

Referring now to the comparators, 130A, 130B, and 130C, the comparators 130A, 130B, and 130C establish three detection levels to provide four distinct outputs depending on the relationship of the multilevel data signal $S_m$ to the three detection levels. Accordingly, the inputs of the comparators 130A, 130B, and 130C are coupled together to form a common differential input terminal to receive the multilevel data signal $S_m$.

Also, each of the comparators 130A, 130B, and 130C has a differential output terminal coupled to the decoder 140. The decoder 140 receives each of the comparators' 130A, 130B, and 130C differential output signal (e.g., a level determination signal) from their respective differential output terminal, and decodes the data transmitted via the multilevel data signal $S_m$ based on the received differential output signals.

As mentioned above, the comparators 130A, 130B, and 130C collectively provide four distinct outputs to the decoder. Each of these outputs corresponds to a particular one of the four signal levels of generated by a PAM-4 transmitter, which encodes two bits of data. Accordingly, the decoder can decode the two bits of data transmitted by the PAM-4 multilevel data signal $S_m$.

According to an aspect of the present invention, the detection levels of the comparators 130A, 130B, and 130C are controlled using mismatched differential circuits.

For example, the first comparator 130A may include a first mismatched differential circuit that has a first offset voltage $V_{os1}$ to enable the first detection level voltage $V_{R1}$, the second comparator 130B may include a second mismatched differential circuit that has a second offset voltage $V_{os2}$ to enable the second detection level voltage $V_{R2}$, and the third comparator 130C may include a third mismatched differential circuit that has a third offset voltage $V_{os3}$ to enable the third detection level voltage $V_{R3}$.

According to one embodiment of the present invention, each of the mismatched differential circuits included in the respective comparator 130A, 130B, or 130C has a different offset voltage $V_{os}$ from the other ones in order to provide the three different detection levels.

Figure 2:
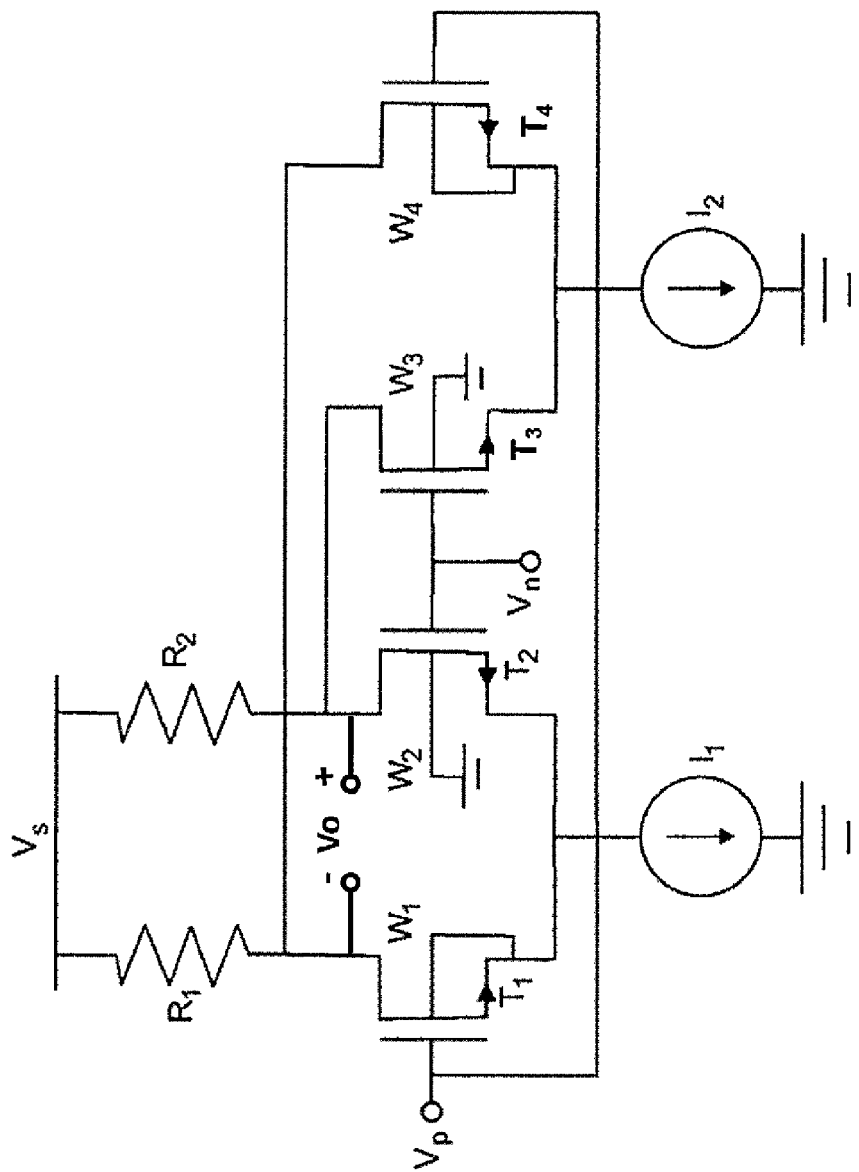
FIG. 2 illustrates a mismatched differential circuit according to an embodiment of the present invention.

Referring now to FIG. 2, which illustrates a mismatched differential circuit according to an embodiment of the present invention.

The mismatched differential circuit 10 of FIG. 2 illustrates an embodiment of the present invention that provides a triple-mismatched differential pair. That is, the mismatched differential circuit 10 illustrates a differential amplifier circuit that may have property mismatches in device bulk potential, device size, and bias current. A person of ordinary skill in the art would recognize that the present invention is not restricted to triple-mismatched differential circuits, but instead, may use any of a variety of differential circuits.

The mismatched differential circuit 10 according to the present embodiment includes two differential amplifier pairs.

Specifically, the mismatched differential circuit 10 of FIG. 2 includes first through fourth transistors $T_1$ through $T_4$, where each transistor corresponds to one amplifier stage of one of the two amplifier pairs. Here, the first transistor $T_1$ and the second transistor $T_2$ have their sources commonly coupled to a first current sink $I_1$ and are coupled to a voltage source $V_s$ through respective resistors $R_1$ and $R_2$. The first and second transistors $T_1$ and $T_2$ correspond to the first differential amplifier pair. The third transistor $T_3$ and the fourth transistor $T_4$ similarly have their sources commonly coupled to a second current sink $I_2$ and are coupled to the voltage source $V_s$ through respective resistors $R_1$ and $R_2$. The third and fourth transistors $T_3$ and $T_4$ correspond to the second differential amplifier pair.

The first and second differential amplifier pairs are coupled together to effectively operate as a single differential amplifier pair. That is, the first and second differential pairs collectively receive the same differential input signal and operate together to produce a single differential output signal.

A feature of using the two coupled differential amplifier pairs is that the different current sinks may be mismatched so as to provide additional offset voltage range. For example, the value of the current of the first current sink $I_1$ may be set to be larger than the value of the current of the second current sink $I_2$, which creates an asymmetric amplifying leg resulting in the sought after control of the offset voltage.

Another feature of using the two coupled differential amplifier pairs is that there are more device parameters available to adjust, which expands offset voltage flexibility. For example, the bulk potentials and/or sizes (e.g., widths $W_1$ through $W_4$) of the transistors may be mismatched so as to enable further flexibility in the available offset voltage.

Bulk potentials may be mismatched either statically or dynamically. Static bulk potential mismatch may be achieved by directly connecting the bulk of a transistor to its source, a ground potential, or a static voltage source. Dynamic bulk potential mismatch may be achieved by connection the bulk of a transistor to a variable voltage source or by enabling the dynamic connection of the bulk to various nodes (e.g., ground, voltage source, or device source).

The differential circuit further includes two input nodes to receive a complementary pair of input signals $V_p$ and $V_n$, respectively, and two output nodes to output the complementary pair of output signals $V_{o+}$ and $V_{o-}$, respectively. In the present embodiment, the two input nodes are at the gates of the transistors $T_1$ thru $T_4$, and the output nodes are at the drains of the transistors $T_1$ thru $T_4$.

The complementary pair of input signals $V_p$ and $V_n$ (together, the differential input signal) are differentially amplified (i.e., subtracted and multiplied) by the differential pair to generate the complementary pair of output signals $V_{o+}$ and $V_{o-}$ (together, the differential output signal).

Due to the mismatch in the amplifier pairs, the differential amplification is asymmetrical as to the different inputs. This asymmetry introduces the offset voltage, described above, and results in establishing the detection level for a comparator.

Figure 3:
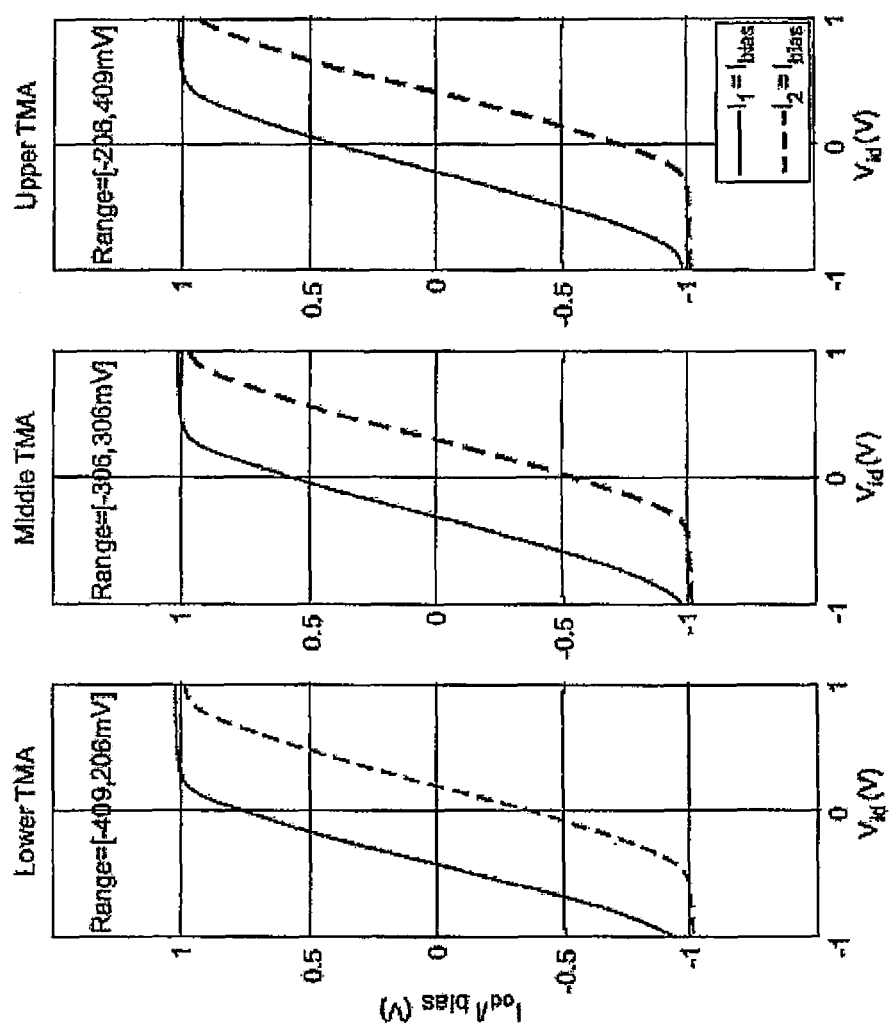
FIG. 3 depicts graphs illustrating the I-V characteristics of three differential circuits according to embodiments of the present invention.

Examples of achievable offset voltage ranges are illustrated in FIG. 3. FIG. 3 shows graphs illustrating the I-V characteristics of differential circuits according to embodiments of the present invention.

FIG. 3 illustrates I-V characteristic ranges for three differential circuits. These three I-V characteristic graphs may correspond to the three differential circuits for comparators 130A, 130B, and 130C described above in connection with FIG. 1. As illustrated in these graphs, the three mismatched differential circuits are configurable to provide a lower, middle, and upper set of offset voltage ranges to correspond to the lower, middle, and upper detection levels of comparators used in a multilevel receiver.

According to one embodiment, the lower and upper mismatched differential circuits are triple-mismatched differential circuits, which are configurable to have bulk potential, device size, and bias current mismatches. The lower and upper mismatched differential circuits may be mirrors of each other. That is, amplifier legs in the lower mismatched differential circuit may have a particular mismatch of circuit properties and the amplifier legs in the upper mismatched differential circuit may have a corresponding, but reversed, mismatch of circuit properties (e.g., reversed as to which leg has which circuit properties).

For example, referring back to FIG. 2, the lower mismatched differential circuit may be configured such that the first and fourth transistors $T_1$ and $T_4$ have a bulk-to-source connection, the second and third $T_2$ and $T_3$ transistors have a bulk-to-ground connection, and the first and third transistors' widths $W_1$ and $W_3$ are the same size and greater than the second and fourth transistors' widths $W_2$ and $W_4$ (which are the same size). This configuration results in a first offset voltage $V_{os1}$. For example, in an embodiment where the first and third widths $W_1$ and $W_3$ are about 4.8 μm and the second and fourth widths $W_2$ and $W_4$ are about 1.2 μm, the first offset voltage $V_{os1}$ may be about −203 mV.

By configuring the upper mismatched differential circuit in a corresponding, but opposite fashion to the lower mismatched differential circuit, it may have a third offset voltage $V_{os3}$ that is the same magnitude but opposite in polarity as the first offset voltage $V_{os1}$. For example, the upper mismatched differential circuit may be configured such that the first and fourth transistors $T_1$ and $T_4$ have a bulk-to-ground connection, the second and third $T_2$ and $T_3$ transistors have a bulk-to-source connection, and the first and third transistors' widths $W_1$ and $W_3$ are the same size and less than the second and fourth transistors' widths $W_2$ and $W_4$ (which are the same size). In an embodiment where the first and third widths $W_1$ and $W_3$ are about 1.2 μm and the second and fourth widths $W_2$ and $W_4$ are about 4.8 μm, the third offset voltage $V_{os3}$ may be about +203 mV.

Accordingly, with this mirrored mismatch configuration, the lower and upper mismatched differential circuits may have offset voltages of the same magnitude, but with different polarity.

Also, according to one embodiment, the middle differential circuit may be configured such that its device properties are matched (i.e., that it is balanced) so that its offset voltage $V_{os2}$ is at 0V.

Furthermore, as described above, these differential circuits are configurable to have a triple-mismatch by adjusting a bias current. For example, referring back to FIG. 2, the current sinks $I_1$ and $I_2$ (collectively, setting the bias current) may be mismatched to further extend the offset voltage range. This may be implemented dynamically or statically. The I-V graphs of FIG. 3 illustrate an embodiment of this scenario.

In FIG. 3, the x-axis represents a differential input voltage and the y-axis represents a differential output current for the differential circuits. In each of the graphs, the solid line represents a configuration where the bias current is wholly supplied by the first current sink $I_1$ and the dashed line represents a configuration where the bias current is wholly supplied by the second current sink $I_2$. The area between these two lines are within the operable range of the mismatched differential circuits, and are achieved by adjusting the mismatch of the first and second current sinks $I_1$ and $I_2$. According to one embodiment the bias current is variable according the following expression: bias current=$I_1+I_2$.

In one embodiment, the offset voltage ranges are centered on the offset voltage for the configuration where the bias current is balanced between the first and second current sinks $I_1$ and $I_2$. As such, the center of the offset voltage ranges correspond to the above-description of the first and third offset voltages $V_{os1}$ and $V_{os3}$ respectively corresponding to the mirrored lower and upper mismatched differential circuits and the second offset voltage $V_{os2}$ corresponding to the balanced middle differential circuit.

According to one embodiment, the bias current is about 400 µA. Therefore, the value of the currents of the first and second current sinks $I_1$ and $I_2$ add up to 400 µA. Here, the magnitude of the offset voltage range may be about 600 mV.

Accordingly, an embodiment of the lower mismatched differential circuit may have an offset voltage centered at about −203 mV and a range of about −409 mV to about 206 mV, an embodiment of the middle mismatched differential circuit may have an offset voltage centered at about 0V and a range of about −306 mV to about 306 mV, and an embodiment of the upper mismatched differential circuit may have an offset voltage centered at about 203 mV and a range of about −206 mV to about 409 mV.

As such, when configuring comparators having mismatched differential circuits according to embodiments of the present invention for use in a multilevel signal receiver, a wide range of detection levels are available.

Referring back to FIG. 1, according to one embodiment of the present invention, each of the comparators 130A, 130B, and 130C includes a circuit corresponding to the differential circuit 10 described above in connection with FIG. 2. Here, each of the differential circuits 10 included with the respective comparator 130A, 130B, or 130C has a different offset voltage $V_{os}$ from the other ones in order to provide the three different detection levels.

For example, the first comparator 130A may include a width mismatched differential circuit to provide the first detection level voltage $V_{R1}$, the second comparator 130B may include a bulk mismatched differential circuit to provide the second detection level voltage $V_{R2}$, and the third comparator may include a width and bulk mismatched differential circuit to provide the third detection level voltage $V_{R3}$.

As described above, the detection level voltage of a particular comparator is based on the offset voltage of its differential circuit. The offset voltage of a differential circuit is further based on the overdrive voltage of an input device (e.g., a transistor in an amplifier leg) in the differential circuit. Specifically, the overdrive voltage may be defined by the equation, $V_{OV}=V_{GS}-V_t$. Where $V_{OV}$ is the overdrive voltage of the input device, $V_{GS}$ is the gate-to-source voltage of the input device, and $V_t$ is the threshold voltage of the device.

The input device's threshold voltage may fluctuate according to process, voltage, and temperature (PVT) variations. Accordingly, the comparator's detection level may fluctuate in-turn according to PVT variations. By way of examples, process variations include variations in the device as a result of manufacturing, which may include differences between chips and within chips; voltage variations may include variations due to different supply voltages, noise, or resistive voltage drop; and temperature variations may include ambient, chip, or local temperature variations.

Figure 4:
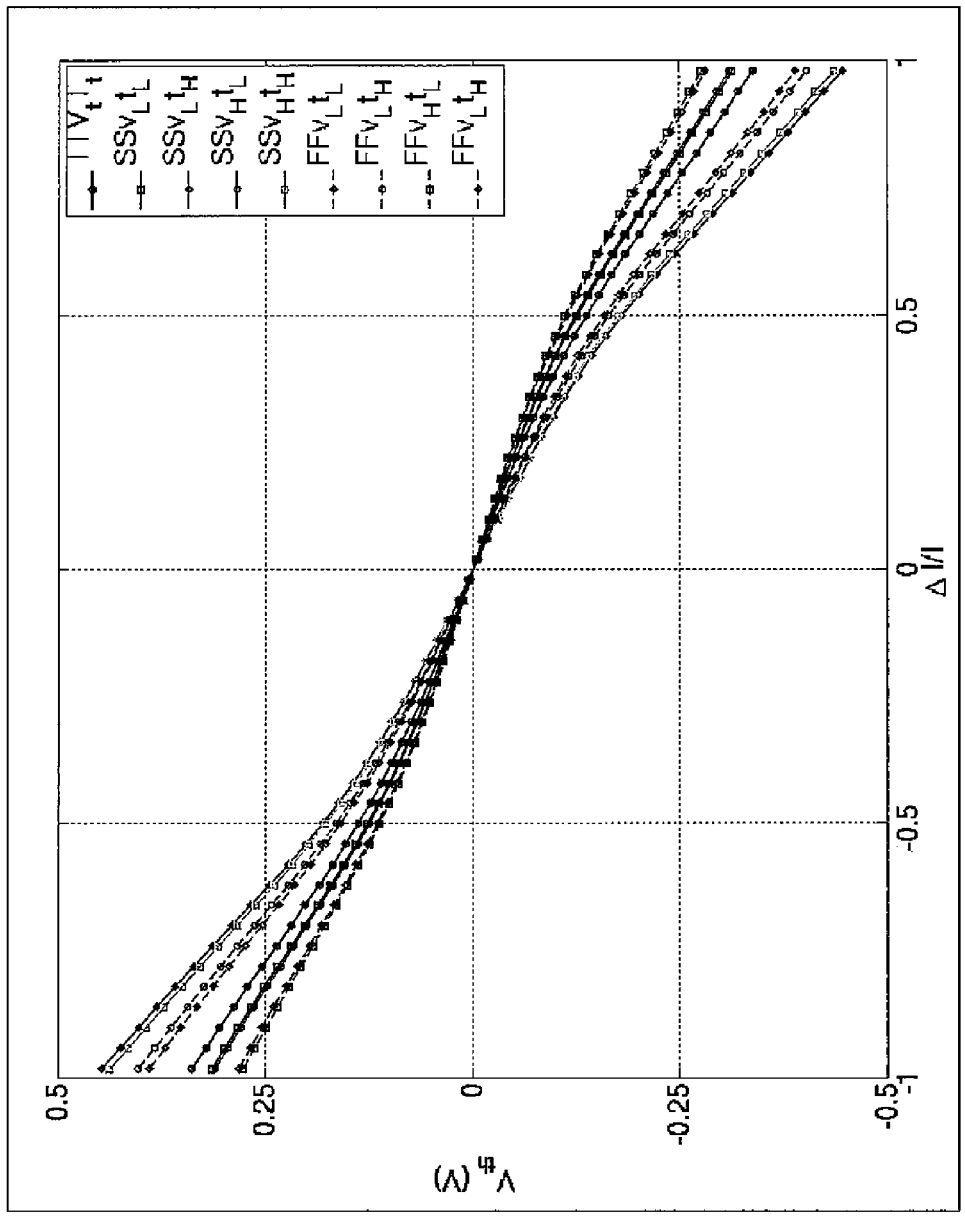
FIG. 4 depicts a graph illustrating the impact of PVT variations on the offset voltage of a differential circuit device.

Referring now to FIG. 4, FIG. 4 depicts a graph illustrating the impact of PVT variations on the offset voltage a differential circuit device.

FIG. 4 illustrates nine (9) waveforms to show the impact that PVT variations may have on the offset voltage of an uncompensated differential circuit device. In this example, it can be assumed that the waveforms correspond to the mismatched differential circuit illustrated in FIG. 2 under various process and environmental conditions. Further, it can be assumed that the first current sink $I_1$ sinks a current according to the equation I+ΔI; and the second current sink $I_2$ sinks a current according to the equation I−ΔI.

In FIG. 4, the x-axis shows the ratio of current mismatch to the total bias current. Specifically, the x-axis corresponds to ΔI/I. Additionally, the y-axis corresponds to the offset voltage of the differential circuit.

Each of the nine (9) waveforms has the following naming convention: $NPV_XT_X$. Where, N corresponds to an N-type transistor, which may be designated T, S, or F; T designating a typical device, S designating a slow device, and F designating a fast device. Where P corresponds to a P-type transistor, which may be designated T, S, or F; T, S, and F having similar meanings as above. The designations for N and P are used to signify process variations. V is used to signify voltage variations, which may be designated as T, L, or H; T designating a typical voltage, L designating a low voltage, and H designating a high voltage. The final T is used to signify temperature variations, which may be designated as T, L, or H; T designating a typical temperature, L designating a low temperature, and H designating a high temperature.

The first waveform $TTV_TT_T$ illustrates the typical (or average) process and operating conditions and is shown with a solid black line with circles. The second waveform $SSV_LT_L$ illustrates a slow device with low temperature and voltage operating conditions, and is shown with a solid black line with squares. The third waveform $SSV_LT_H$ illustrates a slow device with low temperature and high voltage operating conditions, and is shown with a solid black line with diamonds. The fourth waveform $SSV_HT_L$ illustrates a slow device with high temperature and low voltage operating conditions, and is shown with a solid grey line with circles. The fifth waveform $SSV_LT_H$ illustrates a slow device with high temperature and voltage operating conditions, and is shown with a solid grey line with diamonds. The sixth waveform $FFV_LT_L$ illustrates a fast device with low temperature and voltage operating conditions, and is shown with a broken black line with diamonds. The seventh waveform $FFV_LT_H$ illustrates a fast device with low temperature and high voltage operating conditions, and is shown with a broken black line with circles. The eighth waveform $FFV_HT_L$ illustrates a fast device with high temperature and low voltage operating conditions, and is shown with a broken black line with squares. The ninth waveform $FFV_HT_H$ illustrates a fast device with high temperature and voltage operating conditions, and is shown with a broken grey line with diamonds.

As seen in FIG. 4, there is a non-uniformity among the different conditions. The below chart illustrates this non-uniformity by showing the variation in offset voltage at two bias current conditions.

| | $TTV_T T_T$ | $SSV_L T_L$ | $SSV_L T_H$ | $SSV_H T_L$ | $SSV_H T_H$ | $FFV_L T_L$ | $FFV_L T_H$ | $FFV_H T_L$ | $FFV_H T_H$ |
|---|---|---|---|---|---|---|---|---|---|
| $\Delta I/I = 1$ | −338 | −314 | −446 | −310 | −436 | −281 | −403 | −277 | −390 |
| $\Delta I/I = -1$ | 338 | 314 | 446 | 310 | 436 | 281 | 403 | 277 | 390 |

All values in mV.

As described above, the variation of the offset voltage in relation to PVT conditions results in a fluctuation of the detection level of a comparator. This is undesirable, and as such, aspects of the present invention provide for automatic calibration of the differential circuits to maintain a detection level of the comparator in the face of PVT variation. That is, embodiments of the present invention provide PVT tolerant differential circuits.

Referring back to FIG. 1, FIG. 1 illustrates a multi-level receiver 100 including a data slicer 120 having a replica stage comparator 130D. The replica stage comparator 130D enables the automatic calibration of the comparators' 130A, 130B, and 130C detection levels regardless of PVT variations.

According to an embodiment, the detection levels of the comparators 130A, 130B, and 130C are maintained by dynamically adjusting the bias current of each of the comparators' 130A, 130B, and 130C respective differential circuit. Adjusting the bias current of the respective differential circuits compensates for the PVT variations because the overdrive voltages of the input devices (and thus, the threshold levels of the comparators) are a function of their bias currents. Thus, by enforcing the right bias current to fix the overdrive voltage across PVT variations, each comparator's threshold level voltage may be maintained.

In this regard, the replica stage comparator 130D may employ a replica stage differential circuit to automatically find the correct bias current for the present operating conditions, and may enforce that bias current on the differential circuits of the first, second, and third comparators 103A, 130B, and 130C so that they may maintain their appropriate threshold levels.

Figure 5:
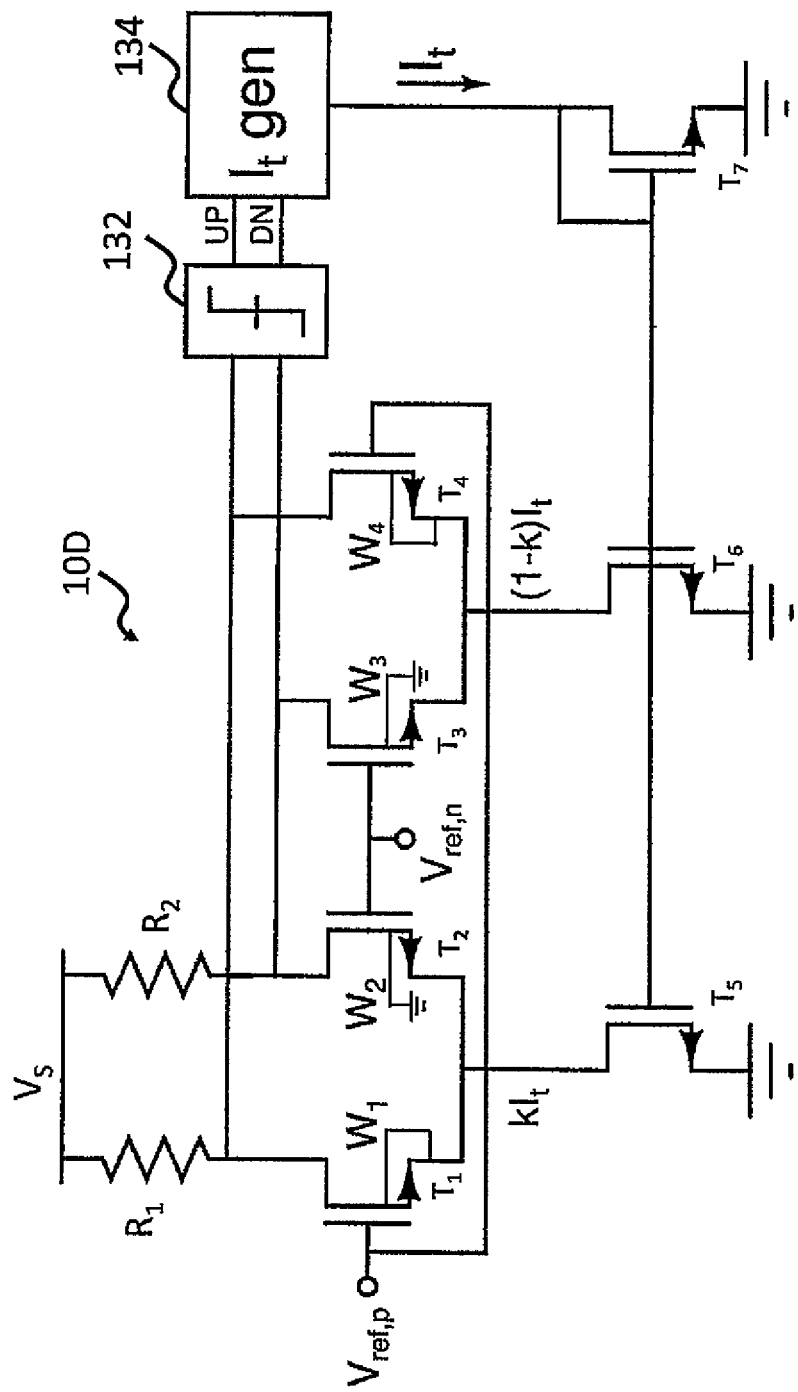
FIG. 5 illustrates a replica stage differential circuit according to an embodiment of the present invention.

FIG. 5 illustrates a replica stage differential circuit according to an embodiment of the present invention.

The replica stage differential circuit may be a replica of a differential circuit that actually receives a data signal. For example, in an embodiment where the replica stage differential circuit is included in a data splitter of a multilevel receiver, the replica stage differential circuit may be a replica of a differential circuit of a comparator that receives the multilevel signal.

For ease of explanation, the replica stage differential circuits described herein correspond to the mismatched differential circuit 10 illustrated in FIG. 2. However, a person of ordinary skill in the art would recognize that the scope of the present invention is not so limited.

FIG. 5 illustrates a replica stage differential amplifier 10D, which shares many similarities with the differential amplifier 10 described above. Accordingly, detailed descriptions of some of the components of the replica stage differential amplifier are given by way of reference to the above discussion of the differential amplifier 10.

The replica stage differential circuit 10D of FIG. 5 includes first through fourth transistors $T_1$ through $T_4$, where each transistor corresponds to one amplifier stage of one of two amplifier pairs. Here, the first transistor $T_1$ and the second transistor $T_2$ have their sources commonly coupled to a first current sink (or first tail device) and are coupled to a voltage source $V_s$ through respective resistors $R_1$ and $R_2$. The first and second transistors $T_1$ and $T_2$ correspond to the first differential amplifier pair. The third transistor $T_3$ and the fourth transistor $T_4$ similarly have their sources commonly coupled to a second current sink (or second tail device) and are coupled to the voltage source $V_s$ through respective resistors $R_1$ and $R_2$. The third and fourth transistors $T_3$ and $T_4$ correspond to the second differential amplifier pair.

The first and second differential amplifier pairs are coupled together to effectively operate as a single differential amplifier pair. That is, the first and second differential pairs collective receive the same differential input signal and operate together to produce a single differential output signal (i.e., a positive and negative output signal).

The first current sink is provided by a fifth transistor $T_5$, which is set to sink a current $kI_r$. The second current sink is provided by a sixth transistor $T_6$, which is set to sink a current $(1-k)I_r$. Here, k is corresponds to a property of the differential circuit. It is a parameter that represents the mismatch in bias current between the first and second current sinks.

The reference current $I_r$ is generated by a current generator 134 and is output to a drain of the seventh transistor $T_7$. The drain of the seventh transistor $T_7$ is tied to its gate and to the gate of the fifth and sixth transistors $T_5$ and $T_6$. This copies the gate voltage of the seventh transistor $T_7$ to the gates of the fifth and sixth transistors $T_5$ and $T_6$, which effectively copies (or proportionally copies) the reference current $I_r$ to the first and second current sinks (i.e., the current mirror circuit).

The reference current $I_r$ is set as part of a feedback loop. The feedback loop automatically adjusts the reference current $I_r$ in response to PVT variations.

In the present embodiment, the feedback loop includes a comparator 132 at the differential output of the differential circuit, which controls the setting of the current generator 134. As described, above, the current generator 134 sets the reference current $I_r$, which is copied to the first and second current sinks of the differential circuit, thus setting the bias current. Because the differential output of the differential circuit is a function of the bias current, setting the bias current closes the feedback loop.

As described above, the offset voltage of a differential circuit fluctuates in response to PVT variations. Accordingly, when a PVT change happens during operation, the fluctuation in offset voltage will result in a change in the differential output of the differential circuit. The comparator 132 will detect this change and control the current generator 134 to change the reference current $I_r$.

According to one embodiment, the replica differential circuit is configured to have an equilibrium where the differential output signal is at (or near) 0V. That is, where the two output nodes of the differential circuit are the same. Here, when the two output nodes are not the same, the comparator 132 will control the current generator 134 to increment or decrement the reference current $I_r$, until a new equilibrium is found.

According to one embodiment, the comparator 132 may be a digital comparator and the current generator 134 may be a digitally controlled current generator. Here, the comparator 132 sends a 1 or 0 to instruct the current generator 134 to increment or decrement the reference current $I_r$.

According to one embodiment, the feedback loop may include a hysteresis or delay circuit to avoid chatter.

A differential reference signal $V_{ref}$ ($V_{ref,p}$ and $V_{ref,n}$) may be applied to the input of the replica stage differential circuit 10D under a known operating condition. That is the differential reference signal may be a constant reference signal, for example, the differential reference signal may be set to the threshold level voltage of the replica differential circuit (e.g., a maximum achievable detection setting of the circuit).

As described above, the outputs $V_{O+}, V_{O-}$ of the replica stage differential circuit 10D may be received by the comparator 132 that controls the current generator 134 to generate a reference current $I_t$ to force the outputs of the replica stage differential circuit to be at the same voltage for the given reference voltage at the differential input. The reference current $I_t$ corresponds to the replica stage bias current. By copying the replica stage bias current to an input stage differential circuit of a comparator actually receiving an input signal, the input stage differential circuit is automatically calibrated in light of PVT variations. The bias current may be copied, for example, using a current mirror (with or without an amplifier to adjust for device differences) or by using a signal (e.g., a digital signal) to set signal controllable current sinks in the input stage differential circuit.

According to one embodiment, the properties of the replica differential circuit are set to their maximum (i.e., at one extreme or at a corner) where there may be the largest fluctuation in the output of the differential circuit due to PVT variations.

Figure 6:
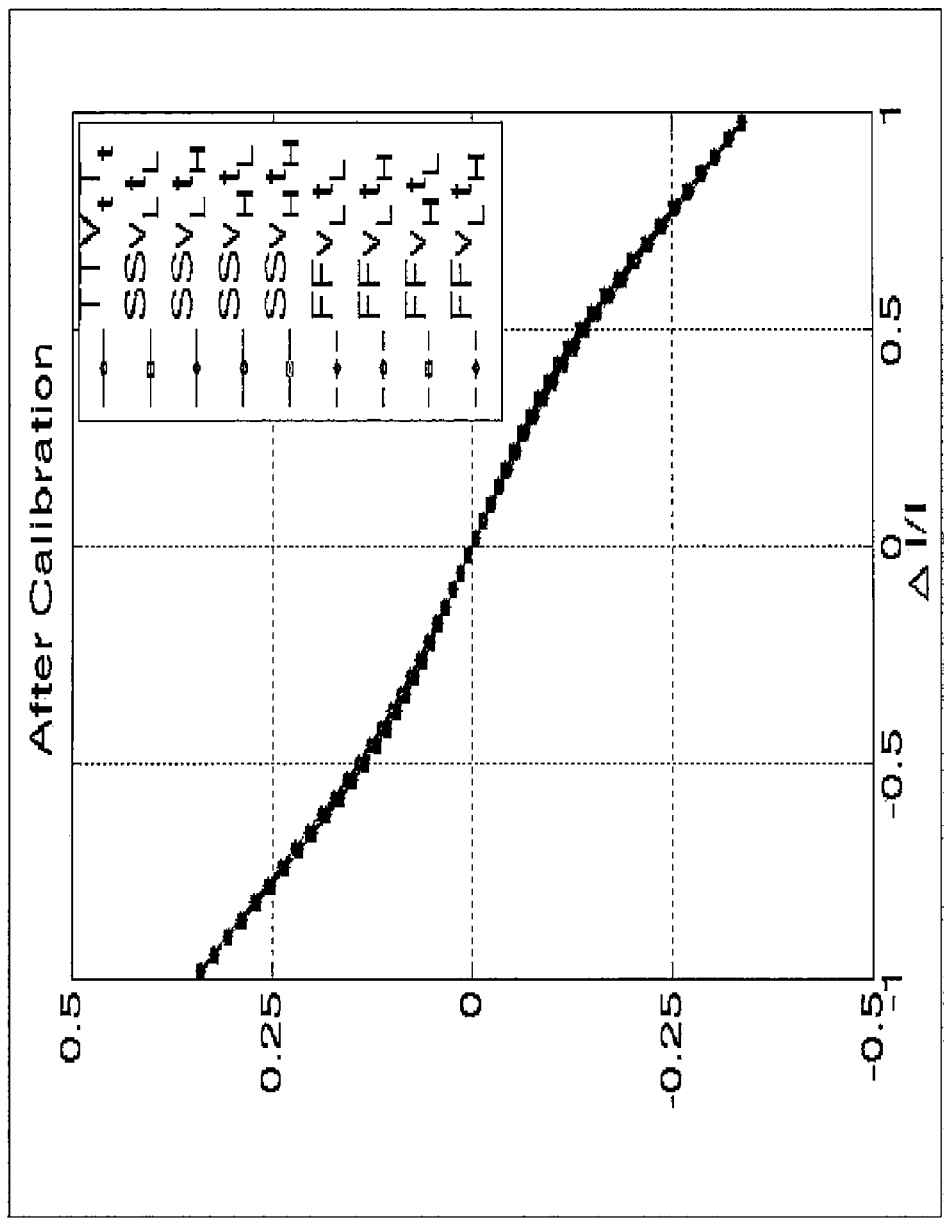
FIG. 6 depicts a graph illustrating the resiliency against the impact of PVT variations on the offset voltage of a differential circuit device according to an embodiment of the present invention.

Referring now to FIG. 6, FIG. 6 depicts a graph illustrating the resiliency against the impact of PVT variations on the offset voltage of a differential circuit device according to an embodiment of the present invention.

FIG. 6 illustrates nine (9) waveforms corresponding to the nine (9) waveforms shown above in FIG. 4. Accordingly, the descriptions of the waveforms are given by way of reference to the above-disclosure of FIG. 4. The waveforms of FIG. 6 differ from those of FIG. 4 in one significant aspect—they correspond to a calibrated differential circuit.

As evident by comparing the graphs of FIGS. 4 and 6, the impact that PVT variations have on the offset voltage of the calibrated differential circuit device is minimal. As seen in FIG. 6, there is a substantial uniformity among the different operating conditions. The below chart provides an example of this uniformity:

descriptions of some of the components of the replica stage differential amplifier are given by way of reference to the above discussion of the replica stage differential amplifier 10D.

In the replica stage differential circuit 10D' the reference current $I_t$ is generated by a negative feedback controlled transistor. In the present embodiment, the feedback loop includes an amplifier 136 at the differential output of the differential circuit. An output of the amplifier 136 is connected to the gate of an eighth transistor $T_8$ (here a P-MOS transistor). The source of the eighth transistor $T_8$ is coupled to the voltage source $V_s$. The amplifier 136 controls the voltage at the gate of the eighth transistor $T_8$ to provide the reference current $I_t$, which is copied to the first and second current sinks of the replica differential circuit to set the bias current. Because the differential output of the differential circuit is a function of the bias current, setting the bias current closes the feedback loop.

As described above, the offset voltage of a differential circuit fluctuates in response to PVT variations. Accordingly, when a PVT change happens during operation, the fluctuation in offset voltage will result in a change in the differential output of the differential circuit. The amplifier 136 will detect this change and control the eighth transistor $T_8$ to change the reference current $I_t$.

According to one embodiment, the replica differential circuit is configured to have an equilibrium where the differential output signal is at (or near) 0V. That is, where the two output nodes of the differential circuit are the same. Here, when the two output nodes are not the same, the negative feedback circuit will adjust the reference current $I_t$ until a new equilibrium is found.

As described above the reference current $I_t$ corresponds to the replica stage bias current. By copying the replica stage bias current to an input stage differential circuit of a comparator actually receiving an input signal, the input stage differential circuit is automatically calibrated in light of PVT variations.

The differential circuits according to embodiments of the present invention may be formed of complementary metal oxide semiconductor (CMOS) devices. For example, as illustrated in FIG. 2, the mismatched differential circuits may be formed of N-MOS field effect transistors (FETs). As one of ordinary skill in the art would appreciate, however, the scope of the present invention applies to devices other than those

|  | $TTV_TT_T$ | $SSV_LT_L$ | $SSV_LT_H$ | $SSV_HT_L$ | $SSV_HT_H$ | $FFV_LT_L$ | $FFV_LT_H$ | $FFV_HT_L$ | $FFV_HT_H$ |
|---|---|---|---|---|---|---|---|---|---|
| ΔI/I = 1 | −338 | −338 | −339 | −339 | −338 | −337 | −338 | −339 | −338 |
| ΔI/I = −1 | 338 | 338 | 339 | 339 | 338 | 337 | 338 | 339 | 338 |

According to aspects of the present invention, the replica stage comparator maintains the detection level of the input stage comparator under a variety of temperature and voltage conditions or under a variety of process corners. The above-described calibration together with a constant swing load keeps the threshold voltage, as well as an effective gain, of a differential circuit device constant across a PVT range. Calibration at a single detection level may be sufficient to guarantee tracking across all points because the threshold value may have a mild nonlinear dependence on the bias current.

Figure 7:
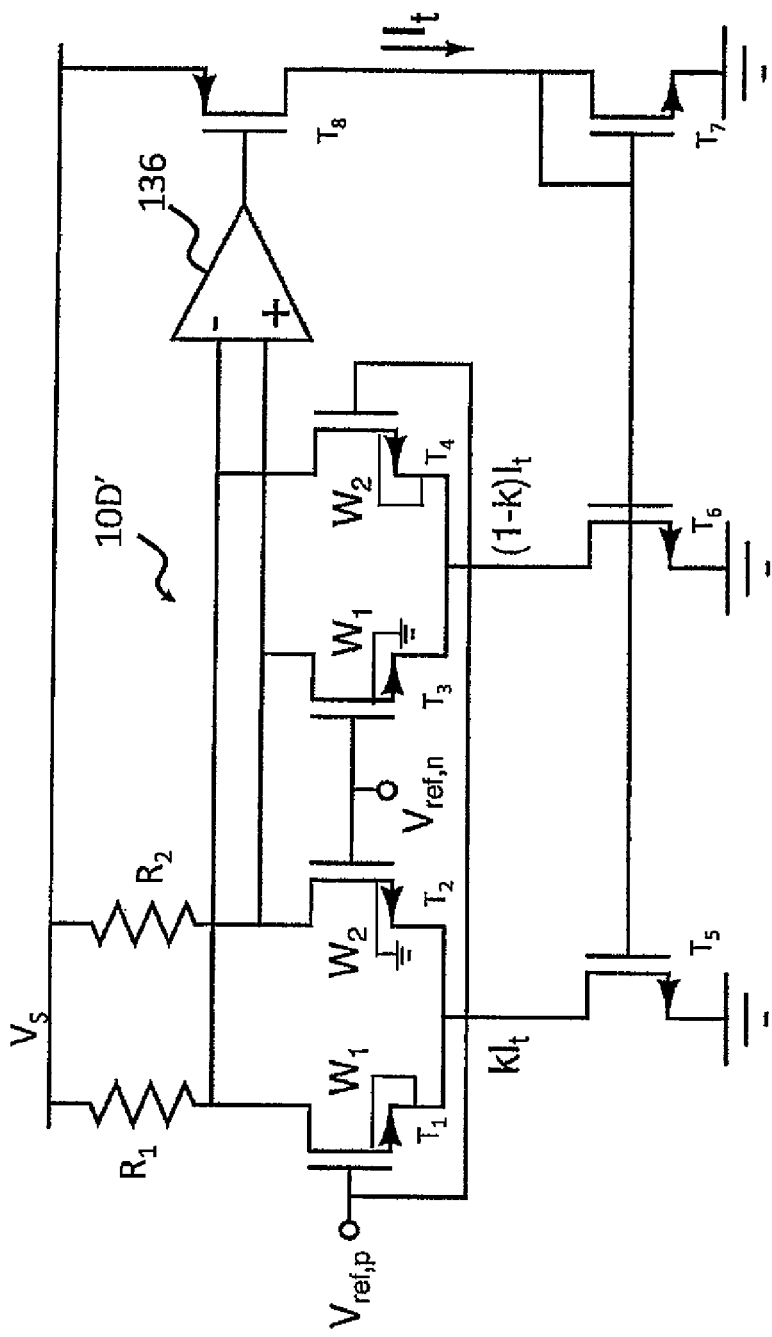
FIG. 7 illustrates a replica stage differential circuit according to another embodiment of the present invention.

FIG. 7 illustrates a replica stage differential circuit according to another embodiment of the present invention.

The replica stage differential circuit 10D' of FIG. 7 shares some similar features and components with the replica stage differential circuit 10D of FIG. 5. Accordingly, detailed explicitly described and illustrated in the present application. For example, differential circuits according to the present invention may be implemented using P-MOS FETs.

Figure 8:
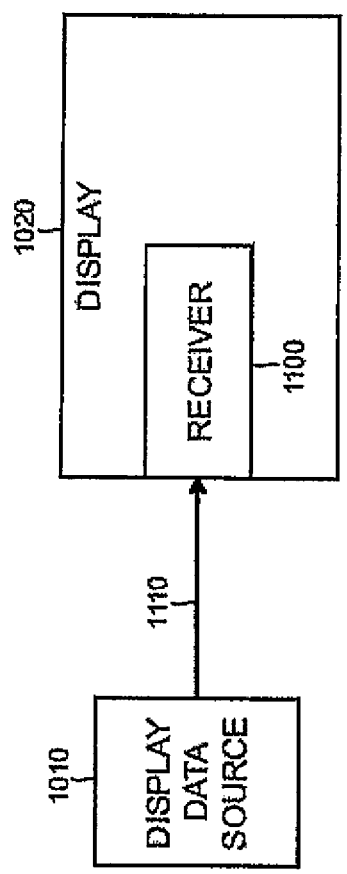
FIG. 8 is a block diagram of a digital communication link for a display according to an embodiment of the present invention.

FIG. 8 illustrates an exemplary application of a receiver in a digital communication link for a display according to an embodiment of the present invention. In the present embodiment, a display data source 1010 transmits a display data signal over a transmission link 1110 to a display 1020. The display data signal may include information for displaying an image on the display. The display may be, for example, an organic light emitting diode display, a liquid crystal display, or a plasma display.

The display 1020 includes a receiver 1100. The receiver 1100 may be implemented with the receiver circuit 100 described above in connection with FIGS. 1-8. That is, the receiver 1100 may be implemented using PVT tolerant differential circuits.

While aspects of the present invention have been illustrated and described in connection with certain exemplary embodiments, it is to be understood that the invention is not limited to the described embodiments, but, on the contrary, is intended to cover various modifications and equivalent arrangements included within the spirit and scope of the appended claims.

For example, while some exemplary embodiments of the present invention were described in connection with a PAM-4 multilevel data system, embodiments of the present invention are not limited thereto. That is, the aspects and features of the present invention may be variously applied, such as in other pulse amplitude modulation systems (e.g., PAM-5, -6, -7, etc.), in digital-to-analog converters, peak-detectors, or any other application that mismatched differential circuits may be used.

As a further example, although various embodiments of the present invention utilize a triple-mismatched amplifier/triple-mismatched differential circuits, other embodiments of the present invention may use different circuits to accomplish the discussed aspects of the invention. For example, other embodiments of the present invention may use a double-mismatched amplifier that allows for construction of the discussed feedback loop/feedback circuit.

What is claimed is:

1. An automatically calibrated differential amplifier comprising:
    an input stage differential amplifier configured to receive an input differential signal, to differentially amplify the input differential signal to generate an input stage output differential signal, and to have an input stage bias current; and
    a replica stage differential amplifier configured to automatically calibrate the input stage bias current in response to process or environmental variations and to have a replica stage bias current, the replica stage differential amplifier comprising a feedback circuit configured to receive an output of the replica stage differential amplifier and to adjust the replica stage bias current according to the output of the replica stage differential amplifier,
    wherein the input stage differential amplifier comprises a plurality of differential amplifier pairs that are coupled to each other at their inputs to receive the input differential signal.

2. The automatically calibrated differential amplifier of claim 1,
    wherein the replica stage differential amplifier is configured to:
        receive a reference differential signal;
        differentially amplify the reference differential signal to provide a replica stage output differential signal; and
        provide a reference current based on the replica stage output differential signal, and
    wherein the replica stage bias current and the input stage bias current are based on the reference current.

3. An automatically calibrated differential amplifier comprising:
    an input stage differential amplifier configured to receive an input differential signal, to differentially amplify the input differential signal to generate an input stage output differential signal, and to have an input stage bias current, the input stage differential amplifier comprising a plurality of differential amplifier pairs that are coupled to each other at their inputs to receive the input differential signal; and
    a replica stage differential amplifier configured to automatically calibrate the input stage bias current in response to process or environmental variations,
    wherein the replica stage differential amplifier is configured to:
        receive a reference differential signal;
        differentially amplify the reference differential signal to provide a replica stage output differential signal; and
        provide a reference current based on the replica stage output differential signal,
    wherein a replica stage bias current and the input stage bias current are based on the reference current,
    wherein the replica stage differential amplifier comprises:
        a first amplifier leg;
        a second amplifier leg; and
        a feedback circuit coupled to the first amplifier leg and the second amplifier leg, and configured to output the reference current,
    wherein the first amplifier leg and the second amplifier leg, together, are configured to differentially amplify the reference differential signal to provide the replica stage output differential signal,
    wherein the feedback circuit receives the replica stage output differential signal and outputs the reference current according to the replica stage output differential signal, and
    wherein a sum of a first amplifier leg current of the first amplifier leg and a second amplifier leg current of the second amplifier leg equals the replica stage bias current.

4. The automatically calibrated differential amplifier of claim 3,
    wherein the feedback circuit comprises a comparator and a current generator, and
    wherein the comparator is configured to receive the replica stage output differential signal and to control the current generator to increment or decrement the reference current according to the replica stage output differential signal.

5. The automatically calibrated differential amplifier of claim 3,
    wherein the feedback circuit comprises an amplifier and a transistor, the transistor being configured to output the reference current, and
    wherein the amplifier is configured to receive the replica stage output differential signal and to control a gate voltage of the transistor according to the replica stage output differential signal to adjust the reference current.

6. The automatically calibrated differential amplifier of claim 2,
    wherein the replica stage differential amplifier further comprises:
        a first resistor having a first terminal coupled to a voltage source, and a second terminal;
        a second resistor having a first terminal coupled to the voltage source, and a second terminal;
        a first current sink configured to sink a first current;
        a second current sink configured to sink a second current;
        a first transistor having a first terminal coupled to the second terminal of the first resistor, a second terminal coupled to the first current sink, and a gate terminal configured to receive a first reference signal of the reference differential signal;

a second transistor having a first terminal coupled to the second terminal of the second resistor, a second terminal coupled to the first current sink, and a gate terminal configured to receive a second reference signal of the reference differential signal;

a third transistor having a first terminal coupled to the second terminal of the second resistor, a second terminal coupled to the second current sink, and a gate terminal configured to receive the second reference signal of the reference differential signal;

a fourth transistor having a first terminal coupled to the second terminal of the first resistor, a second terminal coupled to the second current sink, and a gate terminal configured to receive the first reference signal of the reference differential signal; and the feedback circuit configured to receive the replica stage output differential signal from the first terminal of the first transistor and the first terminal of the second transistor, and to output the reference current, wherein the first current and the second current are based on the reference current, and wherein a sum of the first current and the second current equals the replica stage bias current.

7. The automatically calibrated differential amplifier of claim 2, further comprising a current mirror coupled to the input stage differential amplifier and the replica stage differential amplifier, wherein the current mirror copies the reference current to control the input stage bias current.

8. The automatically calibrated differential amplifier of claim 1, wherein the input stage differential amplifier comprises a first amplifier leg comprising a first transistor and a second amplifier leg comprising a second transistor, and is configured to be at an input stage of a comparator, wherein the first amplifier leg and the second amplifier leg, together, are configured to differentially amplify the differential input signal, wherein the input stage differential amplifier is configured to have an input offset voltage, and wherein the input offset voltage corresponds to a difference between a bulk potential of the first transistor and a bulk potential of the second transistor.

9. A multilevel signal receiver comprising:

an input terminal configured to receive a multilevel differential signal;

a data slicer coupled to the input terminal and configured to determine voltage levels of the multilevel differential signal, the data slicer comprising a plurality of input stage comparators and a replica stage comparator; and a decoder coupled to an output of the data slicer and configured to decode bits of the multilevel differential signal, wherein each of the input stage comparators comprises an input stage differential amplifier, the input stage differential amplifier comprising:

a first amplifier leg; and a second amplifier leg, wherein the first amplifier leg and the second amplifier leg, together, are configured to differentially amplify the multilevel differential signal to provide a threshold determination signal, wherein the input stage differential amplifier is configured to have an input offset voltage and an input stage bias current, and wherein each of the input stage comparators is configured to have a threshold level different from the threshold level of other ones of the input comparators, wherein each of the input stage comparators is configured to output its threshold determination signal to the decoder to indicate whether or not the multilevel signal is greater than its threshold level, wherein, for each of the input stage comparators, the threshold level corresponds to the input offset voltage of the input stage differential amplifier, wherein the replica stage comparator comprises a replica stage differential amplifier, the replica stage differential amplifier comprising:

a first amplifier leg;

a second amplifier leg; and a feedback circuit configured to automatically adjust a replica stage bias current according to a replica stage differential output signal, and wherein, for each of the input stage comparators, the input stage bias current of the input stage differential amplifier is based on the replica stage bias current.

10. The multilevel signal receiver of claim 9:

wherein the replica stage differential amplifier is configured to:

receive a reference differential signal;

differentially amplify the reference differential signal to provide the replica stage output differential signal; and provide a reference current based on the replica stage output differential signal, and wherein the replica stage bias current and the input stage bias current are based on the reference current.

11. The multilevel signal receiver of claim 10, wherein the feedback circuit is coupled to the first amplifier leg and the second amplifier leg of the replica stage differential amplifier, and configured to output the reference current, wherein the first amplifier leg and the second amplifier leg of the replica stage differential amplifier, together, are configured to differentially amplify the reference differential signal to provide the replica stage output differential signal, wherein the feedback circuit receives the replica stage output differential signal and outputs the reference current according to the replica stage output differential signal, and wherein a sum of a first amplifier leg current of the first amplifier leg and a second amplifier leg current of the second amplifier leg equals the replica stage bias current.

12. The multilevel signal receiver of claim 11, wherein the feedback circuit comprises a comparator and a current generator, and wherein the comparator is configured to receive the replica stage output differential signal and to control the current generator to increment or decrement the reference current according to the replica stage output differential signal.

13. The multilevel signal receiver of claim 11, wherein the feedback circuit comprises an amplifier and a transistor, the transistor being configured to output the reference current, and wherein the amplifier is configured to receive the replica stage output differential signal and to control a gate voltage of the transistor according to the replica stage output differential signal to adjust the reference current.

14. The multilevel signal receiver of claim 11, further comprising a current mirror coupled to the input stage differential amplifier of each of the input stage comparators and the replica stage differential amplifier,
   wherein the current mirror copies the reference current to control the input stage bias current of the input stage differential amplifier of each of the input stage comparators.

15. The multilevel signal receiver of claim 9,
   wherein the replica stage differential amplifier further comprises:
   a first resistor having a first terminal coupled to a voltage source, and a second terminal;
   a second resistor having a first terminal coupled to the voltage source, and a second terminal;
   a first current sink configured to sink a first current;
   a second current sink configured to sink a second current;
   a first transistor having a first terminal coupled to the second terminal of the first resistor, a second terminal coupled to the first current sink, and a gate terminal configured to receive a first reference signal of a reference differential signal;
   a second transistor having a first terminal coupled to the second terminal of the second resistor, a second terminal coupled to the first current sink, and a gate terminal configured to receive a second reference signal of the reference differential signal;
   a third transistor having a first terminal coupled to the second terminal of the second resistor, a second terminal coupled to the second current sink, and a gate terminal configured to receive the second reference signal of the reference differential signal;
   a fourth transistor having a first terminal coupled to the second terminal of the first resistor, a second terminal coupled to the second current sink, and a gate terminal configured to receive the first reference signal of the reference differential signal; and
   a feedback circuit configured to receive the replica stage output differential signal from the first terminal of the first transistor and the first terminal of the second transistor, and to output a reference current,
   wherein the first current and the second current are based on the reference current, and
   wherein a sum of the first current and the second current equals the replica stage bias current.

16. The multilevel signal receiver of claim 15, wherein the input offset voltage of the input stage differential amplifier of at least one of the input stage comparators corresponds to a difference between a bulk potential of the first transistor and a bulk potential of the second transistor.

* * * * *